United States Patent [19]

Harrington et al.

[11] Patent Number: 4,610,730

[45] Date of Patent: Sep. 9, 1986

[54] FABRICATION PROCESS FOR BIPOLAR DEVICES

[75] Inventors: Alan L. Harrington, Hawthorne; Vladimir Rodov, Redondo Beach, both of Calif.

[73] Assignee: TRW Inc., Redondo Beach, Calif.

[21] Appl. No.: 684,426

[22] Filed: Dec. 20, 1984

[51] Int. Cl.[4] ............... H01L 21/263; H01L 21/22
[52] U.S. Cl. ........................ 148/1.5; 29/571; 29/576 B; 29/576 T; 148/187; 148/DIG. 10; 357/34; 357/91
[58] Field of Search ............ 148/1.5, 187; 29/571, 29/576 B, 576 T; 357/34, 91

[56] References Cited

U.S. PATENT DOCUMENTS

| | | | |
|---|---|---|---|
| 4,243,433 | 1/1981 | Gibbons | 148/1.5 |
| 4,338,139 | 7/1982 | Shinada | 148/1.5 |
| 4,377,421 | 3/1982 | Wada et al. | 148/1.5 |
| 4,377,902 | 3/1983 | Shinada et al. | 29/576 B |
| 4,381,953 | 5/1983 | Ho | 148/1.5 |
| 4,403,400 | 9/1983 | Sakurai | 29/576 B |
| 4,411,708 | 10/1983 | Winham | 148/1.5 |
| 4,436,557 | 3/1984 | Wood et al. | 148/1.5 |
| 4,452,645 | 6/1984 | Chu et al. | 148/1.5 |
| 4,475,955 | 10/1984 | Patel | 148/1.5 |
| 4,497,665 | 2/1985 | Fukuda | 148/1.5 |
| 4,573,370 | 6/1985 | Sullivan et al. | 29/576 B |

*Primary Examiner*—Upendra Roy
*Attorney, Agent, or Firm*—Noel F. Heal

[57] ABSTRACT

A method for the fabrication of semiconductor devices, particularly bipolar silicon devices, having ultra-shallow but relatively large junctions. The process is characterized by the use of relatively low temperatures for critical oxidations steps and for ion-implantation steps. The region implantations are performed at low temperature and the necessary annealing steps are deferred until all of the regions are in place. Then a single pulse-annealing step is employed, to minimize further movement of the region junctions. Processing-induced defects are thereby reduced to a minimum, and the process can be used to produce ultra-shallow junctions in a reliable and repeatable manner.

12 Claims, 16 Drawing Figures

FABRICATION PROCESS FOR BIPOLAR DEVICES

BACKGROUND OF THE INVENTION

This invention relates generally to processes for the fabrication of bipolar transistor devices, and more particularly, to processes for producing bipolar devices for use at high powers and frequencies. At higher frequencies, extremely shallow junction depths are required, and at high powers large circuit areas are required, since the power output of a bipolar transistor is approximately proportional to the area of its base region. One approach to meeting the requirement for higher powers and frequencies is to employ gallium arsenide (GaAs) technology, which lends itself better to the formation of relatively large and shallow junctions.

Prior to this invention, it has not been possible to achieve ultra-shallow device junctions in bipolar devices employing silicon technology, except in an uncontrollable manner. With relatively large areas in combination with shallow junction depths, there is a very high level of defects induced by processing of the devices.

Ion implantation is a technique that is generally recognized as affording good control of dopant concentration, area uniformity and depth profile. Basically, ion implantation is the introduction of charged atomic particles into a substrate, for the purpose of changing the electrical properties of a selected region of the substrate. The implantation can be performed at low temperature, such as room temperature, but results in crystalline lattice damage. Typically, the lattice damage is removed by annealing, that is to say exposing the device to a high temperature for a prescribed, and usually long period of time. The annealing temperature is typically around 550 degrees C. or higher.

The structure of a bipolar transistor typically includes a substrate that forms the collector, a base region implanted in the collector, and an emitter region implanted in the base region. One phenomenon that induces device defects resulting from these multiple implantation steps, is known as "base push." This results in a non-uniform junction depth. Base push is caused by the second high-temperature annealing step to which the base region is exposed when the emitter is formed. When the emitter is implanted in the base, this may also have the effect of "pushing" the base-collector junction further into the device.

Other defects may also result from high-temperature oxidation steps in the process. Silicon dioxide is a commonly employed material in many processes involving silicon devices. It is typically formed by a process of thermal oxidation, oxygen is reacted with the silicon device at a temperature of several hundred degrees C. or higher. The process may employ dry oxygen, or may be performed in the presence of steam. Steam growth of the oxide proceeds at a faster rate than dry oxygen growth, but temperatures of several hundred to over a thousand degrees C. are required in each process. When very thin layers of silicon are involved, these high-temperature oxidation processes tend to produce defects known as oxidation-induced stacking faults. These show up as irregular "spikes" or other features in a junction surface.

U.S. Pat. No. 4,381,953 discloses a technique in which a single heat cycle is used to anneal multiple ion implantations. However, the process described in the patent also includes a high-temperature oxidation step, and would therefore be ineffective in solving the problem that the present invention addresses.

It will be apparent from the foregoing that normal high-temperature processing of silicon bipolar devices gives rise to uncontrollable defects of various kinds. One cause of defects is the subsequent movement, by diffusion, of carefully defined regions when the device is reheated for subsequent annealing or oxidation steps. Additional problems may be caused by oxidation-induced stacking faults. It will be appreciated that there is still a need for improvement in the processing of bipolar silicon devices, so that ultra-shallow junctions can be attained in a reliable and repeatable manner. The present invention is directed to this end.

SUMMARY OF THE INVENTION

The present invention resides in a novel sequence of processing steps for the production of semiconductor devices, particularly bipolar devices, with ultra-shallow junctions. Briefly, and in general terms, the method of the invention comprises the steps of forming a semiconductor substrate, defining on the substrate the peripheries of a plurality of semiconductor regions, successively ion-implanting the plurality of regions at low temperatures, without any annealing or activation, and subsequently annealing the ion-implanted regions in one short pulse-annealing step that minimizes further diffusion of the implanted materials. The device is not exposed to high temperatures during processing, and is therefore produced with a minimum of defects.

To minimize defects resulting from high-temperature processing, the step of defining the peripheries of the semiconductor regions includes forming an oxide layer by low-temperature plasma-enhanced low-pressure chemical vapor deposition, and reactive-ion etching the oxide layer to define the periphery of a semiconductor region.

More specifically, in the illustrative embodiment of the invention a base region is formed by ion implantation in a collector substrate, and an emitter region is formed in the base region by ion implantation. However, to avoid subsequent diffusion of the base-region material after implantation, the necessary step of annealing the base region is deferred until the emitter region has been implanted. Then, a pulse-annealing step is used, with a high enough temperature to ensure activation of the implanted regions, but of short enough duration to minimize movement of the region boundaries by diffusion.

In the preferred embodiment of the invention, employed for the fabrication of a silicon bipolar device, a base ballast resistor region is also implanted in the substrate, as are a plurality of semiconductor moat regions around base peripheries, to enhance the voltage breakdown characteristics of the base-collector junctions. The following paragraphs summarize the specific steps necessary to fabricate a silicon bipolar device of the npn type, although it will be understood that, as in other bipolar devices, the polarities of the various regions may be reversed without departing from the principles of the invention.

First, an n− layer is formed on an n+ substrate. Then a mask oxide is formed over the N-layer. Preferably, the mask oxide is formed as two separate layers: a thin layer of dense oxide applied by thermal oxidation at high temperature, followed by a thicker layer of silicon oxide applied by a plasma-enhanced low-pressure chemical vapor deposition process. Using a conventional photoresist process, areas of the oxide layer are selectively removed to define the positions of a base ballast resistor and a moat about the periphery of what will become the base region. Next, p− regions are ion-implanted in the ballast resistor and base moat regions. This ion implantation is performed at room temperature, and no annealing is immediately performed. Next, a plasma-enhanced oxide layer is formed over the entire device, and a photoresist process is used to define the base region periphery. A high-temperature treatment then follows, to drive the p− regions to the desired depth. This high-temperature step precedes the formation of the base and emitter regions, and therefore has no effect on the critical junction positions in the device.

An insulating oxide is next formed over the base region and over the base ballast resistor region, and the base region and ballast resistor are the ion-implanted through the oxide covering the regions. Implanting through the oxide layer results in shallow implanted regions. A photoresist layer is next applied and used to define a p+ region in the p− ballast resistor region. The ballast resistor is then ion-implanted with p+ material, but annealing or activation of the p+ material is performed.

Another plasma-enhanced oxide layer is formed over the device, and the area of an emitter periphery is defined by conventional photoresist steps and reactive ion etching. Another oxide layer is applied using the plasma-enhanced LPCVD technique. Then reactive ion etching is again used to remove the oxide at an emitter opening. Following this step, the emitter region is ion-implanted through the emitter opening in the oxide, but again no anneal or activation has yet been performed.

Next, a layer of polycrystalline silicon (or "poly") is deposited over the entire device. The poly layer is ion-implanted and then annealed at a relatively low temperature. This step is the first anneal to which the base and emitter regions are exposed, and results in conversion of the implanted regions from amorphous to crystalline form. The doped poly layer is next selectively removed using reactive ion etching, leaving the poly material only over the emitter region. Photoresist steps are then used to form openings for base region contacts. Then, another oxide layer is formed by the low-temperature PELPCVD process, over the entire device, and a pulse-annealing step is performed. This is the step that activates the ballast resistor region, the base region, and the emitter region, i.e., it sets the conductivity type and the resistivity without significant movement of the junction edges. The base contact openings are again made, and there follow a sequence of conventional metallization steps to make contact with the base and emitter regions, as well as with the base ballast resistor.

It will be appreciated from the foregoing that the present invention represents a significant advance in the field of fabrication of semiconductor devices with junctions that are relatively large in area but very shallow in depth. In particular, the invention provides a fabrication method that produces multiple regions by low-temperature ion-implantation, with the activation of the the implanted regions being performed in a single annealing pulse. Other critical steps after the implantation of the base region, particularly necessary oxidation steps, are performed by low-temperature processes to avoid unwanted movement of junction surfaces by diffusion. Other aspects and advantages of the invention will become apparent from the following more detailed description, taken in conjunction with the accompanying drawings.

DESCRIPTION OF THE PREFERRED EMBODIMENT

Figure 1:
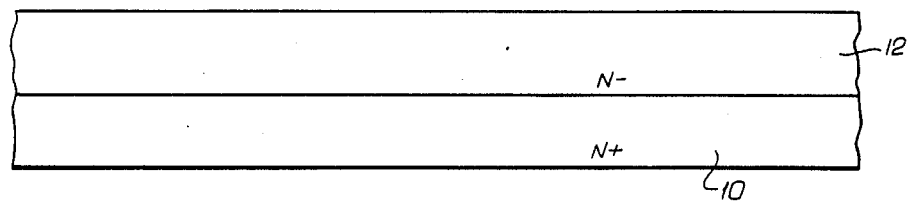
FIGS. 1–16 are together a sequence of cross-sectional views taken at various stages of fabrication of a bipolar device in accordance with the method of the present invention.
Figure 2:
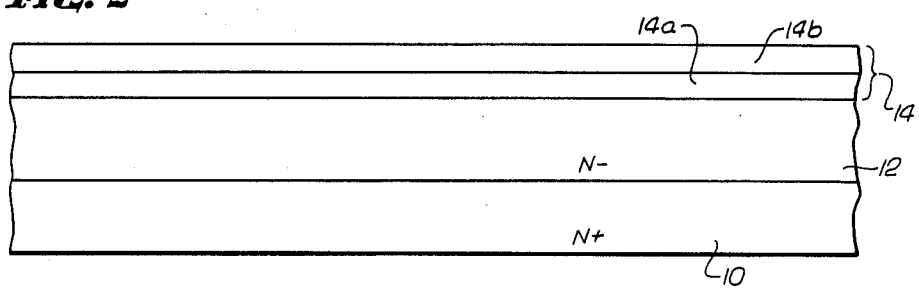

As shown in the drawings for purposes of illustration, the present invention is principally concerned with a technique for the fabrication of bipolar devices with ultra-shallow junctions. For semiconductor devices of relatively high power and high frequency of operation, the device junctions have to be large in area but very very shallow in depth. These requirements have in the past resulted in a high rate of occurrence of processing-induced defects. Since the formation of a bipolar device requires the successive formation of semiconductor regions, i.e. an emitter region formed within a previously formed base region, there is the probability that any high-temperature step after formation of the first region will result in movement of the boundaries of that region, by a process of diffusion. In typical processes, there are also high-temperature oxidation steps and high temperature annealing steps associated with the formation of each region. Consequently, the formation of ultra-shallow regions with any degree of consistency and accuracy is extremely difficult.

In accordance with the invention, all process steps after the implantation of a first selected semiconductor region are performed at low temperature, and activation of multiple ion-implanted regions is deferred until a single common pulse-annealing step performed only after all of the implantations have been made. In this way, unwanted movement of the device junctions is avoided, and the device can be fabricated accurately and consistently without a high rate of device defects.

The specific steps of the process are illustrated by way of example in FIGS. 1–16, which show the formation of an npn silicon device in accordance with the invention. It will be understood, of course, that the polarities of the various regions may be reversed.

As shown in FIG. 1, the device is formed on an n+ substrate, indicated by reference numeral 10. An n− collector region 12 is formed on the substrate. Preferably the n− region 12 consists of a first-formed graded region of which the conductivity makes a graduated transition from n+ to n− conductivity, and an overlaid region of n− material. In this example, the substrate 10 is doped with arsenic, having a resistivity of about 0.002–0.004 ohm-cm, and a thickness of approximately 14–16 mils (0.014–0.016 inch). The graded portion of the n− layer is 3 microns (micrometers) thick, and the upper portion of the n− layer is also 3 microns thick, with a resistivity of 0.75–0.90 ohm-cm.

A mask oxide layer of silicon dioxide 14 is applied to the n− layer 12. First, a thermal oxide layer 14a is formed, to a thickness of 160 Anstroms. Then an additional layer 14b of approximately 6,000 Anstroms thickness is applied over the first layer 14a. The second oxide layer is applied by a plasma-enhanced low-pressure chemical vapor deposition (PELPCVD) process, at a temperature of only about 380 degrees C.

Figure 3:
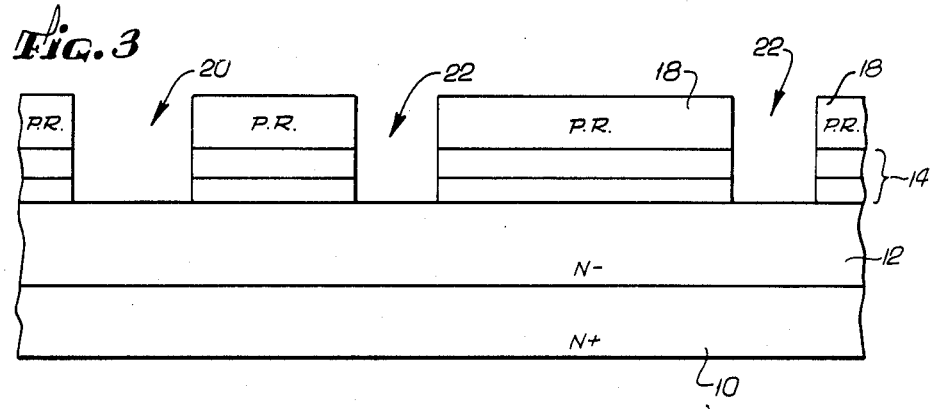

As shown in FIG. 3, a conventional photoresist layer 18 is applied over the oxide layer 14, and is selectively removed to provide an opening 20 to define the position of a base ballast resistor, and an opening 22 to define the position of a base moat located at the periphery of a base region to be formed later.

Figure 4:
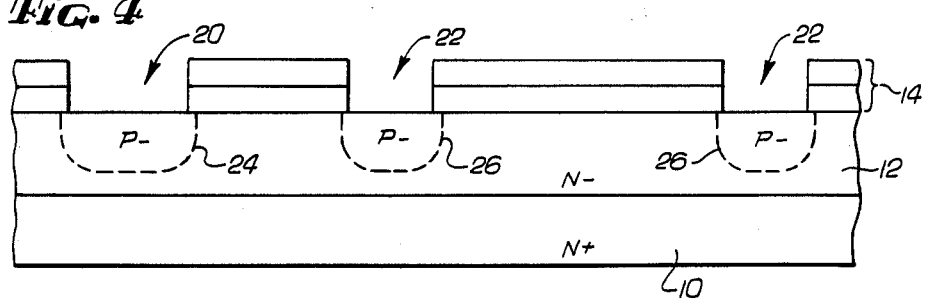
Figure 5:
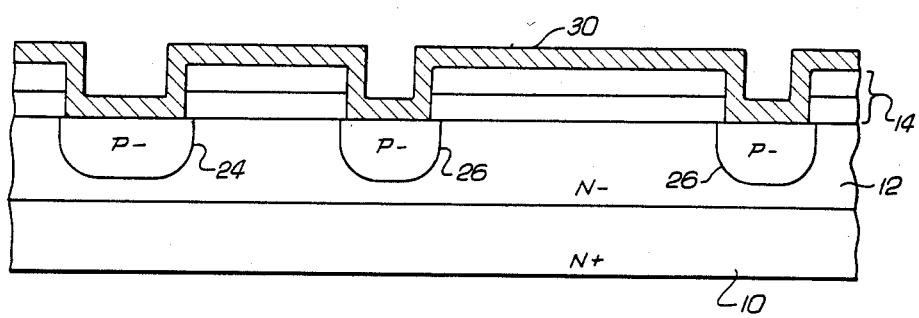

The next step, shown in FIG. 4, is an ion implantation of a p type material, such as boron, to form a p− implantation region 24 used as the ballast resistor, and a p− moat region 26. An annealing step follows, to drive the p− regions to a desired depth in the device. Typically these regions will be several times the depth of the base region to be formed. The first stage of this annealing process may be, for example, at 550 degrees C. for fifteen hours in a hydrogen atmosphere. Another PELPCVD oxidation step follows, to form another oxide layer 30, of about 1,000 Angstroms thickness, as shown in FIG. 5. Openings are formed in this layer, by conventional photoresist steps, above the proposed base region and above the ballast resistor region. Then a second stage of the annealing process drives the p− layers further into the device. For example, this step may be performed at 1,000 degrees C. for sixty minutes, in the presence of dry nitrogen gas.

Figure 6:
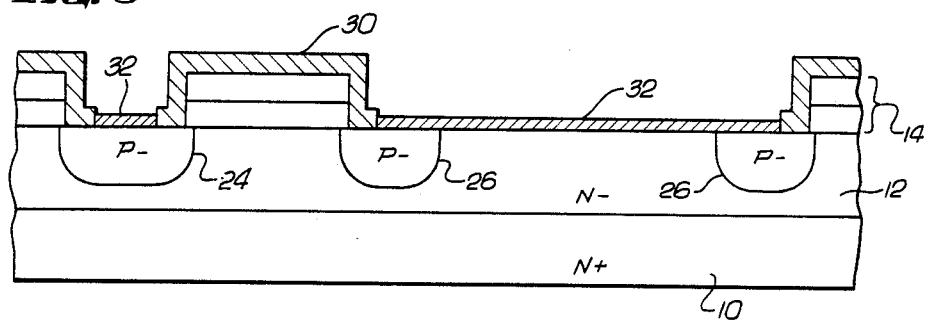

As shown in FIG. 6, an implant oxide layer 32 is next formed over the proposed base and ballast resistor regions. For example, the oxide may be formed at 1,000 degrees C. in the presence of dry oxygen. The target thickness is 875 Angstroms, within a tolerance of 25 Angstroms. Since the base and ballast resistor regions are to be implanted through this oxide layer, its thickness is critical to the process. However, the figure provided is not the only one with which the invention may be used. The oxide layer thickness will, of course, depend on the desired depth of the base-collector junction.

Figure 7:
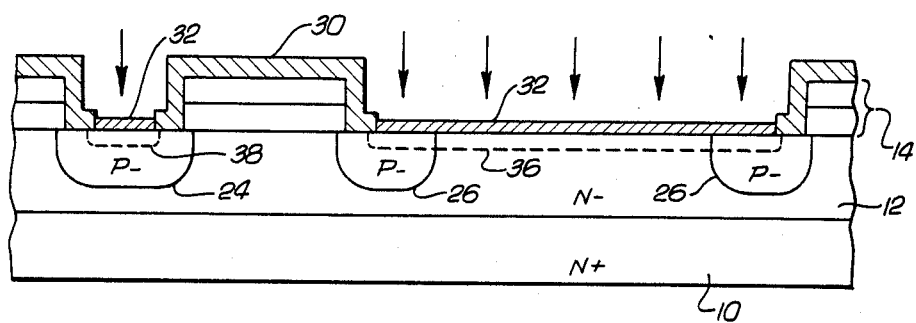

The next step, shown in FIG. 7, is the ion-implantation of a base region 36 and ballast resistor region 38. The implantation is of p type material, such as boron, and takes place through the implant oxide layer 32. Importantly, however, there is no immediately following annealing step.

Figure 8:
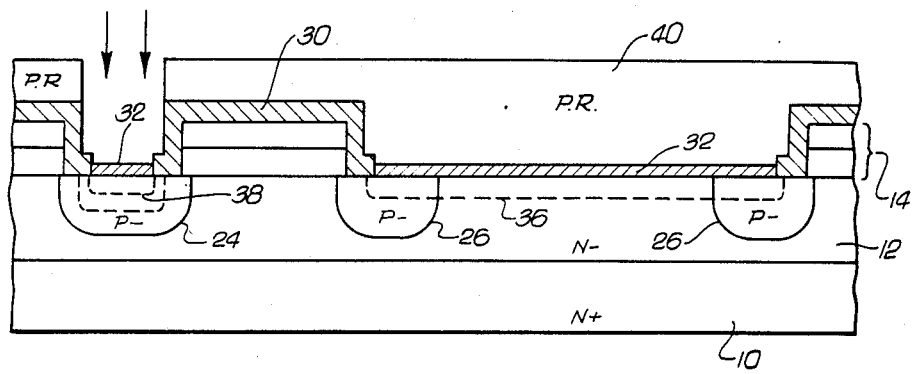
Figure 9:
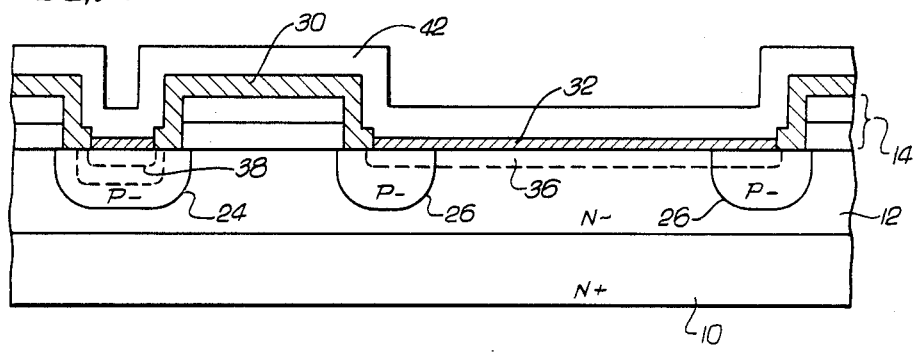
Figure 10:
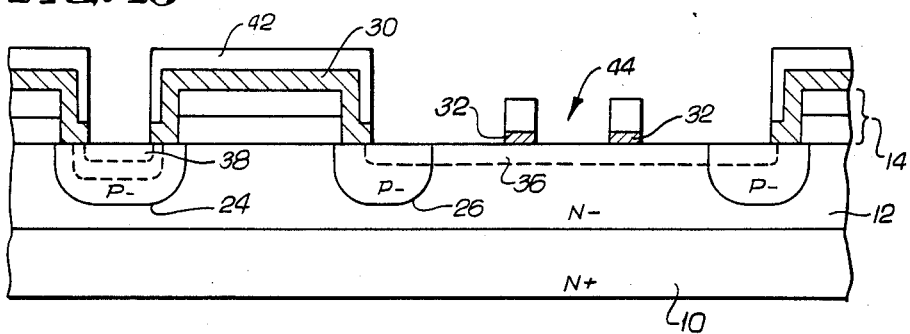
Figure 11:
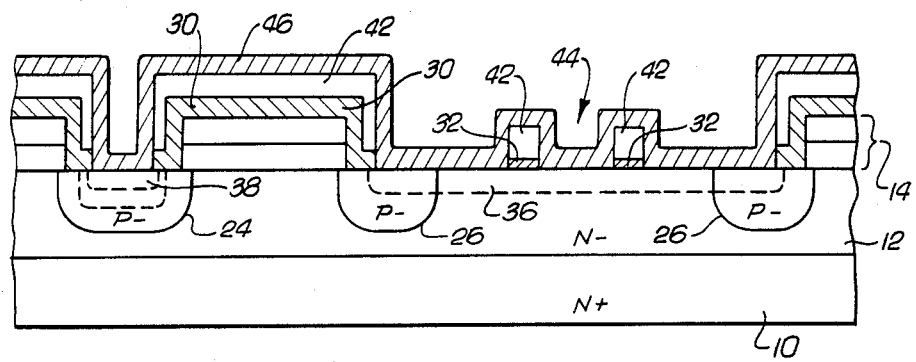
Figure 12:
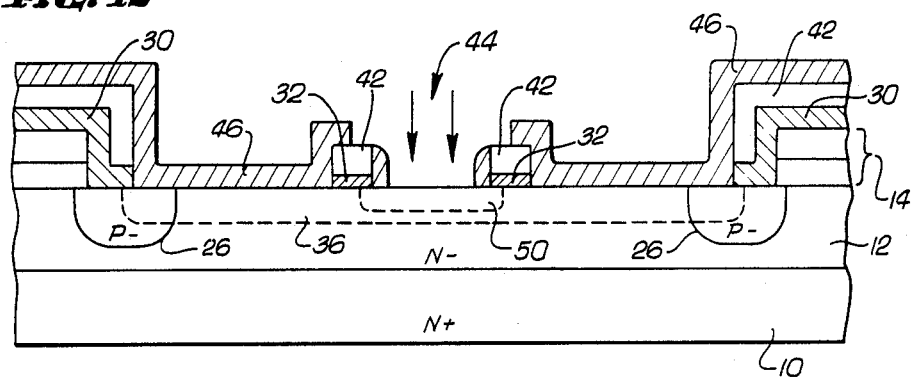

The next step is to apply another photo resist layer 40 and to form an opening above the ballast resistor region 38, as shown in FIG. 8. Another ion-implantation step follows this, to implant p+ material (boron) into the region 38. Another oxide layer 42 is next applied over the entire device, as shown in FIG. 9, and is selectively removed to provide openings over the resistor region 38 and portions of the base region 36, as shown in FIG. 10. At least one of the openings, indicated at 44, defines the periphery of the emitter of the device. In the ensuing steps, another oxide layer 46 is applied by PELPCVD, as shown in FIG. 11, and is selectively removed over the openings 44 by a process of reactive ion etching (RIE), to define openings for the emitter periphery, as shown in FIG. 12. FIGS. 12–16 are drawn to an enlarged scale, encompassing only the portions including the base region and surrounding moat.

Figure 13:
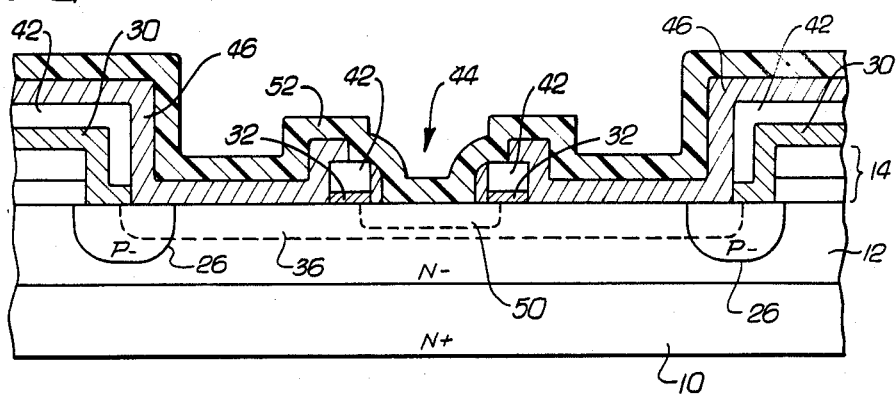

As also shown in FIG. 12, the next step is another ion implantation, this time of the emitter region, indicated at 50. Then, as shown in FIG. 13, a layer 52 of undoped polycrystalline silicon, also known as "poly," is applied over the entire device, to a depth of approximately 1,200 Angstroms, using chemical vapor deposition at 645 degrees C. The poly layer 52 is then ion-implanted, with an n type material, such as arsenic, and the device is subjected to an annealing step, but only at approximately 550 degrees C., for a period of approximately fifteen hours. This is the first long-term anneal of the base region, the ballast resistor region, and the emitter region 50. It results in total recrystallization of these regions, as well of the poly layer 52. However, the temperature is not high enough to provide activation of the regions, and is not sufficient to produce any significant movement of the region junctions.

Figure 14:
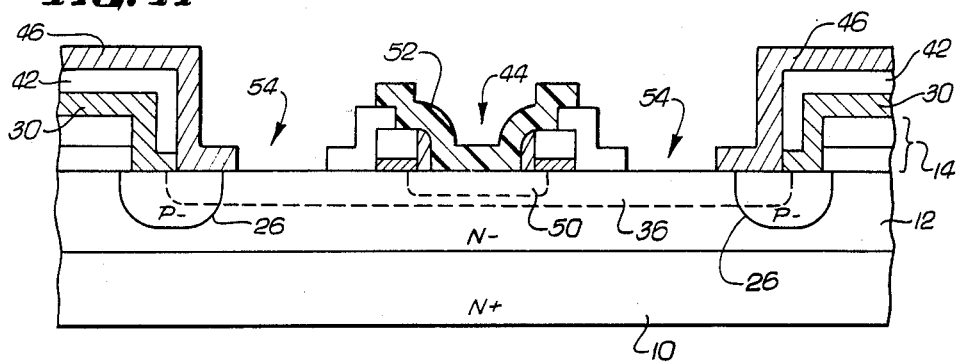
Figure 15:
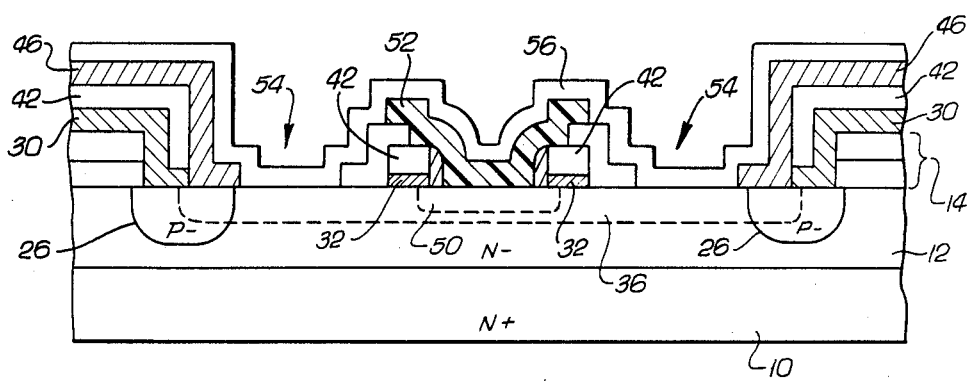

After the anneal step, most of the poly layer 52 is removed by a photoresist step, leaving only a portion above the emitter region 50, as indicated in FIG. 14. In the next step, also shown in FIG. 14, openings 54 are made in the oxide layer over areas of the base region with which electrical contact will be made. These are covered again in the next oxidation step, shown in FIG. 15, which is again a low-temperature oxidation using PELPCVD, and resulting in a silicon oxide layer 56.

The next step is the most important one from from the standpoint of the invention. It is a pulse-annealing step to activate all of the previously implanted semiconductor regions. After a preheat phase of 400 degrees C., the temperature is raised to 1,025 degrees C. for a relatively short time, such as twenty seconds, in the presence of an inert gas, such as argon.

Figure 16:
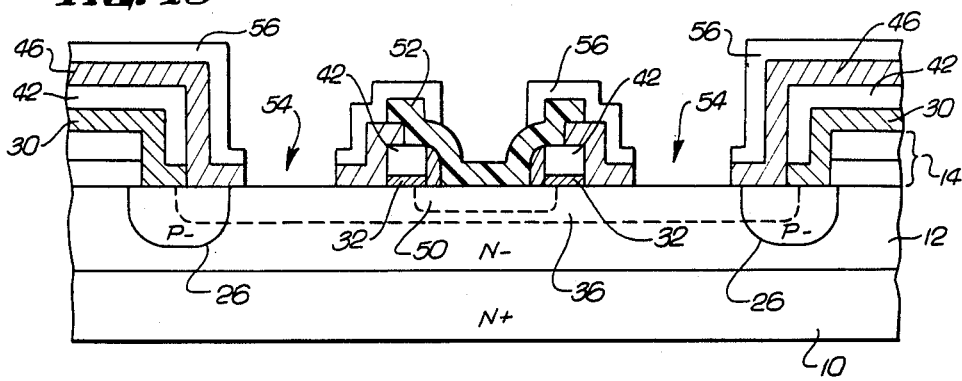

Following the pulse-annealing step, the contact areas above the base region are again opened by photoresist steps, as shown in FIG. 16. All that remains to complete the device is a series of conventional metallization steps used for a two-layer structure with platinum silicide deposited to make contact with the base and emitter regions, as well as with the base ballast resistor region.

It will be appreciated from the foregoing that the present invention represents a significant advance in the field of fabrication of semiconductor devices, such as bipolar silicon devices. In particular, the method of the invention allows the production of devices with extremely shallow junctions and relatively large areas, with a low level of product defects induced by processing. It will also be appreciated that, although a specific embodiment of the invention has been described in detail for purposes of illustration, various modifications may be made without departing from the spirit and scope of the invention. Accordingly, the invention is not to be limited except as by the appended claims.

We claim:

1. A method for the fabrication of bipolar devices with ultra-shallow device junctions, the method comprising the steps of:

forming a semiconductor substrate;

defining on the substrate the peripheries of a plurality of semiconductor regions;

successively ion-implanting the plurality of regions at temperatures low enough to preclude annealing or activation; and subsequently annealing the ion-implanted regions in one short thermal annealing step that minimizes further diffusion of the implanted materials;

wherein the device is not exposed to high temperatures during processing, and therefore is produced with a minimum of defects.

2. A method as set forth in claim 1, wherein:

the step of defining peripheries of the semiconductor regions includes forming oxide layers by a low temperature process.

3. A method as set forth in claim 2, wherein:

the low temperature process is plasma-enhanced low-pressure chemical vapor deposition.

4. A method as set forth in claim 2, wherein:

the step of successively ion-implanting includes ion-implanting a base region in a collector substrate, and ion-implanting an emitter region in the implanted base region.

5. A method for the fabrication of bipolar devices with ultra-shallow device junctions, the method comprising the steps of:
forming a semiconductor substrate;
defining on the substrate the peripheries of a base region and an emitter region within the base region;
ion-implanting the base region at temperatures low enough to preclude annealing or activation;
ion-implanting the emitter region at temperatures low enough to preclude annealing or activation; and
subsequently annealing the ion-implanted base and emitter regions in one short thermal annealing step that minimizes further diffusion of the implanted materials;
wherein the device is not exposed to high temperatures during processing, and therefore is produced with a minimum of defects.

6. A method as set forth in claim 5, wherein:
the step of defining the peripheries of the base and emitter regions includes at least one step of forming an oxide layer by a low-temperature process.

7. A method as set forth in claim 6, wherein:
the low-temperature process is plasma-enhanced low-pressure chemical vapor deposition.

8. A method as set forth in claim 5, and further including the steps of:
forming a moat region around the periphery of the base region; and
forming a base balast resistor region outside the moat region.

9. A method for the fabrication of semiconductor devices with ultra-shallow device junctions, the method comprising the steps of:
forming a semiconductor substrate;
defining on the substrate the peripheries of a plurality of semiconductor regions;
successively ion-implanting the plurality of regions at temperatures low enough to preclude annealing or activation; and
subsequently annealing the ion-implanted regions in one short thermal annealing step that minimizes further diffusion of the implanted materials;
wherein the device is not exposed to high temperatures during processing, and therefore is produced with a minimum of defects.

10. A method for the fabrication of bipolar silicon devices with ultra-shallow junctions, the method comprising the steps of:
forming an n− collector layer on an n+ silicon substrate;
forming a mask oxide layer on the collector layer;
selectively removing portions of the mask oxide layer to define at least one base moat area and at least one ballast resistor area;
ion-implanting p− regions in the defined moat and ballast resistor areas; forming an oxide layer at low temperature over the entire structure;
selectively removing portions of the oxide layer formed in the previous step, to define a base area within the moat region;
subjecting the structure to prolonged heat to drive the implanted p− regions to a desired depth;
forming an implant oxide layer over the base area and the ballast resistor area;
ion-implanting a p+ base region and a p+ ballast resistor region through the implant oxide layer;
forming another oxide layer at low temperature over the entire structure;
selectively removing portions of the last-formed oxide layer, to define at least one emitter area within the base area;
forming another oxide layer over the structure at low temperature;
selectively removing portions of the last-formed oxide layer by reactive ion etching, to define an opening over the emitter periphery;
ion-implanting an n type material to form an emitter region;
forming a polycrystalline silicon layer over the structure;
thermal pulse-annealing the ion-implanted regions to minmize further movement of junctions between regions; and
defining contact areas over the base and emitter regions, for the subsequent formation of metal contact layers.

11. A method as set forth in claim 10, wherein:
the low-temperature oxidation steps employ plasma-enhanced low-pressure chemical vapor deposition.

12. A method as set forth in claim 11, wherein:
the conductivities of the regions are reversed in polarity.

* * * * *